United States Patent [19]

Dill et al.

[11] Patent Number: 4,541,075
[45] Date of Patent: Sep. 10, 1985

[54] RANDOM ACCESS MEMORY HAVING A SECOND INPUT/OUTPUT PORT

[75] Inventors: Frederick H. Dill, South Salem; Daniel T. Ling, Croton-on-Hudson; Richard E. Matick, Peekskill, all of N.Y.

[73] Assignee: International Business Machines Corporation, Armonk, N.Y.

[21] Appl. No.: 393,996

[22] Filed: Jun. 30, 1982

[51] Int. Cl.$^3$ .............................................. G11C 11/40
[52] U.S. Cl. ..................................... 365/189; 365/219
[58] Field of Search ............... 365/189, 219, 220, 221, 365/222

[56] References Cited

U.S. PATENT DOCUMENTS 3,740,723 6/1973 Beausoleil et al. .................. 364/200
3,898,632 8/1975 Spencer, Jr. ......................... 365/219

OTHER PUBLICATIONS 64-k Dynamic RAM Speeds Well Beyond the Pack, Electronic Design, Mar. 19, 1981, pp. 221-225.

Primary Examiner—Joseph A. Popek
Attorney, Agent, or Firm—Pollock, Vande Sande & Priddy

[57] ABSTRACT

A semiconductor random access memory is provided having a second asynchronous input/output port. Block transfers of data can be effected to and from the memory using the second input/output port. Memory throughput efficiency is improved permitting functions such as display refresh in a mapped memory display to be accomplished through the second input/output port. Memory bus contention on the primary port is also relieved. The main input/output port is thereby free to receive new data for a higher percentage of available transfer time since refresh data is available at the second input/output port.

9 Claims, 5 Drawing Figures

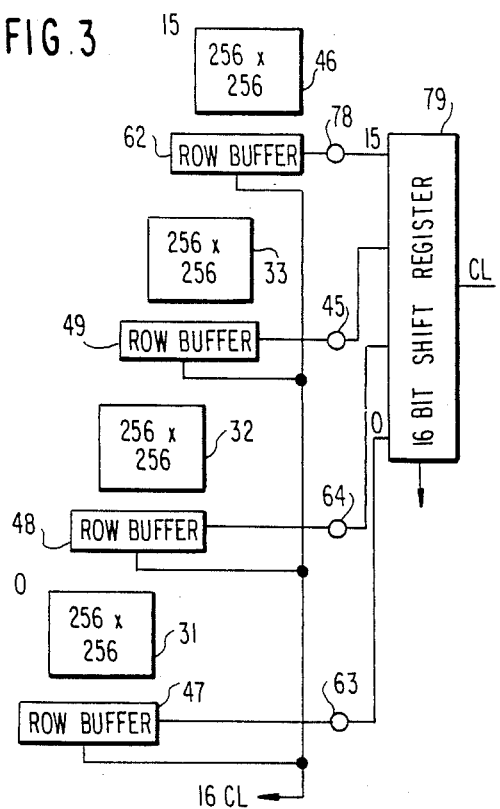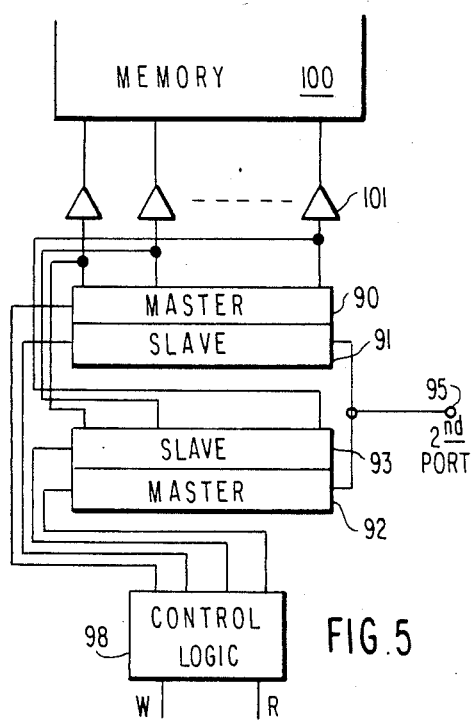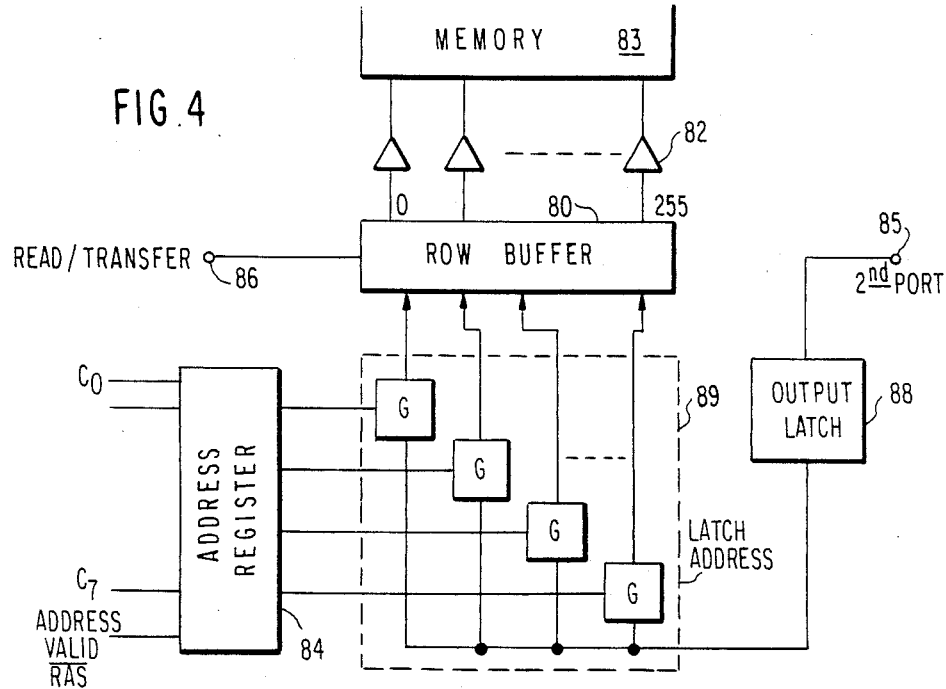

RANDOM ACCESS MEMORY HAVING A SECOND INPUT/OUTPUT PORT

TECHNICAL FIELD

The subject matter of this application relates to two dimensional random access memories. Specifically, a semiconductor random access memory having a second data transfer port is provided for improving the efficiency of data transfer to and from the memory.

Beginning with early core memories, multi-dimensional addressable memories have been available which permit the storage of data in addressable rows and columns. Some early core storage devices permitted an additional third dimension for arranging the storage of data in multiple conceptual phases.

The development of semiconductor memories has continued with a two dimensional format whereby storage elements are arranged in rows and columns of bistable circuit or capacitor electrostatic charge storage elements. The capacitor storage elements in the later type devices require refreshing at periodic intervals to maintain the charge on elements which indicates whether the stored data is a binary 1 or 0. The individual memory elements are addressed by identifying the column and row of a storage element to be read or written.

Memory technology has grown as demands for compact memory storage utilizing semiconductor devices has grown. In response to the demand for these memories, the dynamic random access memory, DRAM, has been developed as a cost effective solution for many memory applications. This type of memory stores an electrostatic charge on a capacitor to represent a binary number digit which is to be stored. The capacitor elements are arranged in rows and columns and WRITE and READ circuits are provided to access each capacitor element and apply the proper charge to the capacitor element for representing a binary one or zero. The capacitor elements are addressed by a plurality of row address bits and a plurality of column address bits supplied to the memory.

The DRAM requires a refresh operation to maintain the proper electrostatic charge on the capacitor. The clock and address structure for the DRAM provides for periodic refresh of the column, typically every two-to-four milliseconds in response to an externally applied signal. The external timing signals applied to a DRAM include the row address signal, RAS, and column address signal, CAS. The random access memory provides in response to these externally applied signals a recharge function and timing signals for addressing each memory cell in response to an additionally supplied address signal. An input/output port, I/O, receives and delivers data in response to a WRITE, and READ command also applied externally to the DRAM.

The internal clocking signals for a semiconductor memory will address a row of the memory cells when a RAS signal is initiated along with a memory cell address. The RAS signal marks the beginning of a memory cycle. Thus, in a memory organized in a 256 by 256 format, whereby 256 rows and 256 columns of memory cells are addressed, during one RAS signal an entire row of 256 cells is outputed to 256 corresponding sense amplifiers. The column address decodes the sense amplifiers which carry information derived from the individual memory cells within the previously addressed row.

The data read or written in the memory passes through a single input/output port in a semiconductor memory. Latches are provided on the memory chip to hold the input/output data until the appropriate RAS and CAS signals are applied to the memory clocking circuits.

The passage of all data through the single input/output port limits the transfer rate of data. Further, 256 cycles of refresh may be required every two-to-four ms in memories of the dynamic type somewhat further reducing the time for transferring data to and from the memory.

In certain applications, such as in mapped raster display techniques, data is provided from the memory to form the CRT image on a display which has a finite decay time before the image will fade. Normally, the screen must be refreshed 25–80 times a second to avoid flicker. Therefore, a continuous data stream must be read from the memory in order to keep the display refreshed. This display refresh function interferes with the updating of memory data by usurping the input/output port at which time no new data may be stored. During the refresh, the processing of data by the processor may need to be halted until the refresh is complete. Therefore, updating a real time display using a mapped raster technique becomes difficult because of the limitations imposed from time sharing the memory between updating information to be written into the memory and reading out data for refresh of the display. In some raster display techniques, the information update occupies less than twenty percent of the available memory cycle time thus inhibiting the realization of a real time graphics display.

With the foregoing problem in mind, the present invention has been devised. The present invention seeks to alleviate the limitations imposed upon memory usage by virtue of all traffic passing to the memory through a single I/O. Although the invention is explained with respect to a mapped display apparatus, the memory may of course be used in other applications to improve the data transfer rate to and from a random access memory.

SUMMARY OF INVENTION

It is a primary object of this invention to increase the data transfer rate into and out of a semiconductor memory.

It is another object of this invention to provide access to a RAM through first and second I/O ports for increasing the data transfer rate of the RAM.

It is a more specific object of this invention to locate a secondary storage device within a RAM which can read or write an entire row in a transfer cycle through a second input port substantially asynchronous with the transfer of data through the principal I/O port of the RAM.

These and other objects are provided with apparatus in accordance with the invention. A random access memory is provided with an internal row buffer register which can transfer rows of data to and from the RAM cells. The row buffer register is connected in parallel format with the sense amplifiers of the RAM. A secondary output port is provided on the RAM chip to receive the row buffer register contents upon receipt of an external pulse signal, or address, depending upon whether a serial or parallel mode is selected.

In a preferred embodiment of the invention, a row buffer shift register is included with a RAM. The row buffer register has a plurality of parallel inputs connected to receive data from sense amplifiers of the RAM. When a row is addressed, and a read transfer pulse is applied to the register from a source external to the RAM, the row word transfer to the row buffer register is completed. A subsequent signal applied to the row buffer shift register will clock the contents of the register to a second input/output port. As an alternative to shifting the data serially out of the row buffer register, a decoder can be employed with the row buffer register to address individual bit storage locations of the row buffer register.

With a memory in accordance with the preferred embodiment, a bit map display device may be improved as a result of the block transfer of data into the row buffer register. The secondary output port is used to supply the refresh information necessary to maintain the CRT display refreshed. The primary I/O port may therefore be used to update the memory with the new pixel data for later display without incurring delays from tying up the primary I/O port with refresh information for the display. Further, the updating of the display memory contents in the main memory while refreshing the display from the row buffer will not result in interference problems for the image.

Other embodiments of the invention permit not only the reading out of blocks of data through the secondary I/O port, but also permit the writing of data blocks through the secondary I/O port in the dynamic RAM. Other uses of the secondary port and row buffer for driving yet other output devices such as printers, disks, communications peripheral equipment through the secondary port are of course possible with a device in accordance with the invention.

DESCRIPTION OF THE FIGURES

FIG. 3 illustrates the use of a random access memory in accordance with FIG. 1 in a refresh operation for a mapped memory display apparatus.

FIG. 4 shows yet another embodiment of the invention for decoding bits contained in a row buffer latch.

FIG. 5 is a block diagram of yet another embodiment of the invention for reading and writing data into the memory through a second port employing master/slave latches.

DESCRIPTION OF THE PREFERRED EMBODIMENT

Figure 1:
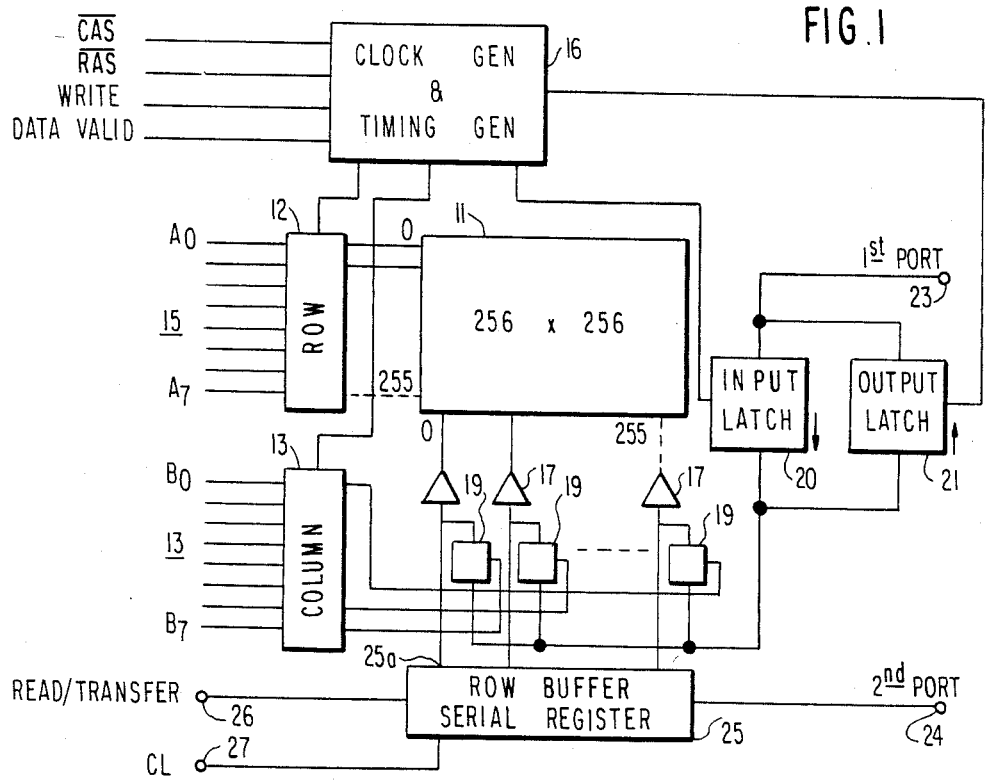
FIG. 1 is a block diagram showing the architecture of a random access memory in accordance with one embodiment of the present invention.

FIG. 1 illustrates the architecture of a dynamic RAM incorporating an embodiment of the present invention. The dynamic RAM includes a matrix 11 of 256×256 memory cells. The technology considered to be preferred for this architecture is the silicon gate, NMOS technique which provides for a compact RAM minimizing the required chip area. Although a dynamic RAM is used in this example the invention can, of course, be implemented in other types of memories.

A clock generator and timing generator 16 provides the internal clocking signals to decode the matrix 11, and latch information to and from the first I/O port 23 through input latch 20 and output latch 21. A plurality of sense amplifiers 17 connected one to each column and in response to a RAS signal and a ROW address, provide an output signal comprising the data stored in that row. A row decoder 12 is employed to receive the row address data on lines A0 through A8 and apply appropriate decoding signals to the matrix 11 in response to a RAS signal. A column decoder 13 receives inputs B0 through B8 and will enable gates connected to the outputs of the sense amplifiers 17 to decode one bit of the addressed row. The foregoing architecture is common to many known dynamic RAMs having an X1 organization.

Included with the dynamic RAM is a row buffer shift register 25. The row buffer shift register has parallel inputs connected to receive outputs from each of the sense amplifiers 17, there being shown only three of the 256 sense amplifiers of the memory.

The row buffer register 25 is a shift register, of the type known to those skilled in the art having a parallel (broadside) loading capability in response to a pulse applied to a READ TRANSFER (RT) terminal 26. The contents of the row buffer register 25 are sequentially gated to a second port 24 when clock pulses are applied from outside the random access memory to terminal 27.

Thus, the foregoing description of a RAM in accordance with one embodiment of the invention includes three additional terminals found on the package containing the RAM. The three terminals include a READ/TRANSFER input 26 for permitting parallel data to be loaded to an internally connected serial register, a port 27 for receiving clock pulses for serially gating the contents of the row buffer register 25, and a second port 24 for delivering the output of the row buffer register 25.

Figure 2:
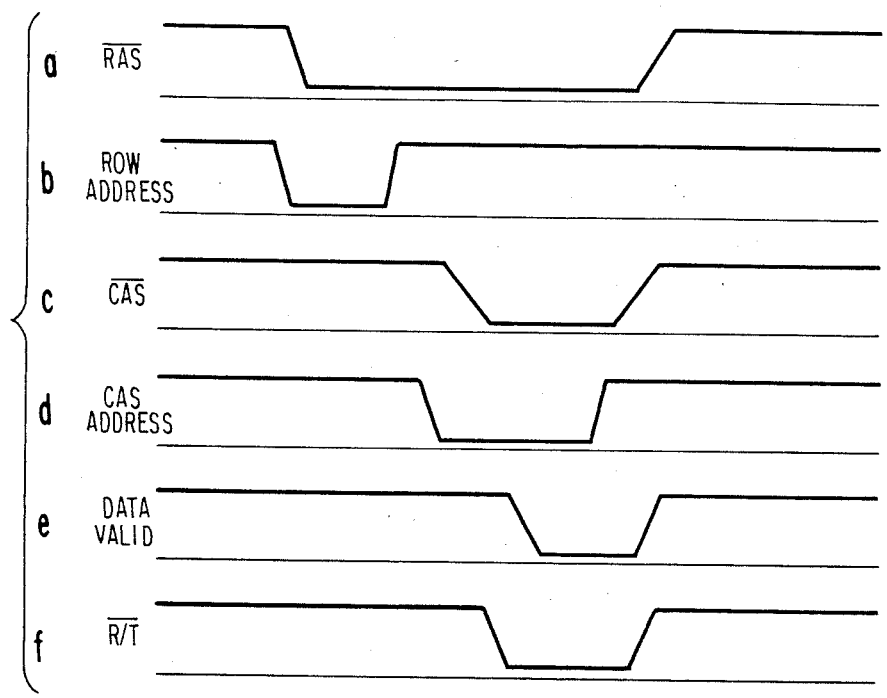
FIG. 2 illustrates the timing diagram for transferring data into and out of the memory of FIG. 1.

Referring now to FIG. 2, there are shown timing diagrams for waveforms supplied external to the RAM to control the transfer of data to and from the RAM. The first is the RAS signal, (a) this signal being used to specify that the signals of the row address, A0 to A7 (FIG. 1), are valid. This signal initiates the memory operation which causes the data in the form of capacitor charge from the specified row of the row of the memory to be switched to the adjacent column line. This row remains active until the RAS signal is removed at the end of the memory cycle. The sense amplifiers are unlatched by the RAS signal, sense the stored column charge and force the column voltage to a 1 or 0 state based on the stored charge state. This causes a refresh of the capacitor storage elements of the addressed memory row comprising the memory 11 during a RAS cycle. In conventional terminology, a RAS signal periodically applied comprises one memory cycle and either refresh occurs, or data access to and from the memory is performed through the main I/O port.

The row address signal must be applied prior to or coincident to a RAS signal for reading or writing data to and from the memory through the first, primary port 23. A short time after the RAS signal the row address, A0 through A7 is latched and can be removed. Subsequently the column address, B0 through B7, can be applied, usually through the same address pins. When this address is valid the CAS signal is applied. A column address signal (CAS) is applied during the RAS signal, which will cause column decoding of any row previously identified, according to the column address B0 through B7. Thus, the CAS signal will initiate the internal clocking signals necessary to operate gates 19 in order to load the output latch when data is read from the memory.

The R/T command, is the READ/TRANSFER command signal applied to the row buffer serial register 25. This must occur at a time after a row has been addressed at the start of a RAS signal. Thus, during the RAS signal when the sense amplifiers 17 contain the stored data for a given row are identified by row addresses, the contents of the sense amplifiers are stored in the row buffer serial register. The present scheme contemplates the insertion of any row word in the row buffer register when it is addressed and the R/T command is applied to terminal 26 and the sense amplifiers contain valid data corresponding to the addressed row.

With apparatus as shown in FIG. 1, and operating in accordance with the timing of FIG. 2, data can be entered in the row buffer register during a memory cycle, independent of the traffic in and out of the main port 23. Data, once stored in row buffer register 25, can be serially transferred through second port 24 in response to the clock pulses applied to terminal 27. Although serial data transfer is shown as the transfer mode to the second I/O port, it is clear that a parallel output decoder may be provided in the same manner as the column decoder of the primary port. In the case of a mapped raster display, a segment of display data can be entered into the row buffer register 25 shortly before the time it is needed for refresh of the display screen. Data transfer to the row buffer can take place at any time in a RAS cycle that the sense amplifiers contain valid data. This can be in a read, write, or refresh (no CAS) cycle. In most embodiments the transfer will take place during a refresh (blank) RAS cycle. Of course, the row buffer register can be implemented where data can also be received by a second port 24 for storage in the row buffer register 25. The stored row buffer register 25 data can be transferred through the sense amplifiers 17 into storage in the dynamic RAM at a row address selected during an appropriate RAS cycle. The row buffer shift register would implement a read transfer command through a plurality of gates for providing the parallel data upon command to the sense amplifiers when a row of memory location for receiving the data is appropriately addressed.

The memory of FIG. 1 may be used in standard memory mapped raster scan display techniques in accordance with FIG. 3. In FIG. 3 are shown 16 memories 31-46 each organized in a 256×256 format. A row buffer register 47-62 is included with each of the memories. Each row buffer register has a serial output connected to ports 63-78 which comprise 16 outputs. The data from output ports 63-78 is serialized with a high speed 16 bit shift register 79 to provide pixel data to a raster scan display.

The apparatus of FIG. 3 is capable of providing a 1024×1024 pixel display refreshed at 40-50 hz. The row buffer registers 47-62 are clocked at a rate of 16CL, or 240 NS, and the 16 bit shift register is clocked at a rate of CL, or typically 15 NS. The row buffer registers are arranged to receive new data each time a row address is provided to the memory and a READ/TRANSFER pulse is applied to the shift register. This is required every 4096 pixels or 4 scan lines. Read/transfer can be done during CRT beam retrace in the raster scan. The retrace time for the display time would be 4 microseconds allowing a very simple window for data transfer. The memory can also receive new data through the primary input/output port while the refresh of the display is taking place. Only one primary port cycle is needed every 75 microseconds with the row buffer rather than every 240 nanoseconds.

Thus using the memory apparatus of FIG. 3, it is possible to provide the data to the row buffer registers in one RAS signal or memory cycle. Thus, one RAS signal will produce 256×16 bits of information for the refresh function of the display, or 4 scan lines in the display. This contrasts with only 16 bits per RAS or memory cycle in a conventional memory which provides the refresh information through the main I/O port.

The second I/O port can deliver data at a rate substantially asynchronous with respect to the first port and at a significantly higher speed. It is not necessary to use the same synchronous clock timing for display refresh and the memory update processing. Thus the refresh operation can occur with an overall improvement to memory throughput.

Referring now to FIG. 4, there is shown yet another embodiment of the invention for more flexible reading of data in the row buffer register through the second port 85. An address input 84 is employed having a plurality of inputs C0-C7 which will receive an address of selected data in the row buffer 80. Those bits are decoded one of 256 lines which turns on one gate switch and allows a single bit to be output in parallel to the 2nd port 85. In this scheme the row buffer register does not have to be capable of data shifting. Data is enabled to the second port merely by presenting an address to C0 to C7 and an appropriate address valid signal to enable output transfer.

Decoder 89 is connected to the row buffer latch and address register 84 in a manner to select a single digit identified by the address applied in register 84. A data valid command enables register 84 when the addressing source has provided a valid address. This technique permits block transfer of data internal to the RAM to the row buffer latch and individual data bit transfers from the row buffer latch outside of the RAM. An optional output latch 88 may be provided to hold addressed data.

In still another embodiment of the invention shown in FIG. 5, data is entered and retrieved in blocks from memory 100 using a pair of master/slave latches 90, 91 and 92, 93. A second I/O port 95 is connected to receive and apply data to and from the master/slave latches. Timing for the master/slave latches 92, 93 is provided internal to the RAM chip by control logic circuit 98. When a WRITE command is applied external to the RAM chip to control logic circuit 98, clocking pulses are applied to master latch 92 to permit serial data appearing at port 95 to be entered into master latch 92. The contents of master latch 92 are parallel loaded into slave 93 where they are held for writing into memory 100. During a RAS cycle, memory 100 is addressed at a memory word location for receiving the contents of slave latch 93 and a WRITE command is given to the memory 100 clock generator and timing generator. The slave latch data 93 is then written by the connected sense amplifiers 101 to the proper row address.

Similarly, master/slave latches 90, 91 are used to read from memory 100 blocks of data in response to a READ signal. Control logic circuit 98 provides enabling signals to the master latch 90 permitting data to be transferred first to the master 90, thence to the slave 91 where it is available as output data to the second port 95.

Using a master-slave combination to transfer data from the second output port to the main memory provides for greater independence between data transferring between the first and second I/O ports. During a read cycle through the second I/O port, row data can be transferred during a memory cycle to a master unit. Row data may thereafter be transferred to the corresponding slave unit for immediate transfer through the second I/O. With data present in the master unit, the slave unit can receive data at any time without waiting an additional memory cycle for row data from the RAM. After transfer from the master to the slave, the master unit is then freed to receive the next row of data from the memory during the period that the slave is being read out through the second port.

During a WRITE operation, similar advantages are achieved by having the slave unit loading ROW data into the memory while the slave unit receives data.

Thus, there has been described with respect to several embodiments, an improved random access memory which will permit blocks of data to be transferred to and from the memory second I/O port thereby permitting a more efficient use of the main I/O port transferring data to and from the memory. Although the apparatus has been described with respect to mapped raster scan display devices, it is clear that the utility provided by the second I/O port may be used for other connected peripheral devices to enhance data flow to and from the memory.

The invention takes advantage of the organization of a two dimensional RAM to provide block transfer of a ROW word during one RAS or memory cycle to a second output port. Thus, in the memory organized in 256×256 format, a single row of 256 bits is transferred at once to a row buffer register during a RAS or single memory cycle. The transfer of the row buffer register contents can then be independent of the main memory data transfer through the first I/O port. In an X1 memory organization, transferring the row data of 256 bits through a single conventional I/O port would require 256 memory cycles. The present invention requires only a single memory cycle to transfer the row data into the buffer register where it may be subsequently transferred through the second port.

TECHNICAL IMPROVEMENT

Improvements in data transfer efficiency on a memory is provided thereby increasing the overall speed of digital processing apparatus.

Having thus described my invention, what I claim as new, and desire to secure by Letters Patent is:

1. In a memory for storing a plurality of digital words, each of said words arranged in a row, like digits of said words forming columns, means for addressing each row of said words, and a sense amplifier for each column of digits, the improvement comprising:
    a row buffer shift register having parallel inputs connected to said sense amplifiers,
    an output port connected only to said row buffer shift register output port,
    a data transfer port connected to said shift register for enabling said shift register to read and store data provided by said sense amplifiers, and
    a clock input port connected to said shift register for serially gating each data bit stored in said register to said output port.

2. A random access memory having a plurality of memory locations arranged in columns for storing the bits of a plurality of words, each of said words comprising a row of said memory locations in said random access memory, including means for addressing data in said rows and columns, a plurality of sense amplifiers for providing data bits to and from said memory locations from a first input/output port, said memory further comprising:
    a second input/output port;
    a row buffer register parallel connected to transfer data with said sense amplifiers; said row buffer register including:
    means for transferring data between said memory locations and said row buffer register in response to a transfer signal; and
    means for transferring data between said row buffer register and said second output port to permit data transfers through said second port substantially independent of data transfers through said first port.

3. A memory device having a plurality of addressable storage locations, said memory device receiving an address signal on one plurality of external connections, data on an input/output port, and including means for transferring data between said memory locations and said input/output port, further comprising:
    a second input/output port for transferring data;
    a bidirectional register means for receiving data from said memory locations, or from said second input/output port;
    control means for controlling the transfer of data between said register means and said memory locations, said control means transferring data from said memory locations to said register in response to a first control signal, and transferring said register data to said second input/output port in response to a second control signal; said control means transferring data from said second port to said register, and from said register to said memory locations in response to third and fourth control signals, whereby data may be transferred between said register and said second port independent of data transferred between said first port and said memory locations.

4. A random access memory having a plurality of storage locations for storing data bits, said storage locations arranged in columns, each storage location forming a row with an adjacent column storage location, whereby a plurality of rows of storage locations are formed; means for addressing a row and column identified by an address signal; a plurality of sense amplifiers connected between said columns and an input/output port, further comprising:
    a second input/output port;
    a row buffer register having a plurality of parallel inputs connected to said sense amplifiers, said row buffer register receiving and storing data from said sense amplifiers in response to a first control signal; and
    a decoder means connected to address said buffer register in response to a second address signal, said buffer register providing a data stream of data bits identified by said second address signal to said second input/output port, whereby each of said input/output ports provide an substantially independent data transfer from said memory.

5. A random access memory according to claim 4 wherein said decoder means provides decoding of a portion of said row buffer register bits.

6. The random access memory of claim 3 whereby said bidirectional register means comprises:
- a first master/slave register combination, the slave portion of said register being serially connected to provide data to said second input port, said master portion being connected to receive in parallel data from said memory locations; and
- a second master/slave register, the master portion of said register connected to receive data from said second port said slave portion connected to transfer data from said associated master portion to said memory locations.

7. In a memory for storing a plurality of digital words, each of said words arranged in a row of digits, like digits of said words forming columns, means for addressing each row of said words, a sense amplifier for each column of digits, and an input/output port connected to transfer data to and from said memory through said sense amplifier, the improvement comprising:
- a row buffer shift register having parallel connections with said sense amplifiers, and a serial data transfer port;
- a second input/output data transfer port connected to said row buffer shift register serial transfer port;
- a first control port connected to said row buffer shift register for transferring data between said shift register and said sense amplifiers; and
- a second control port connected to said row buffer shift register for transferring data between said second data input/output port and said row buffer shift register.

8. In a memory for storing a plurality of digital words, each of said words having digits stored in a row of memory locations, like digits of said words forming columns, said digital words being transferred to and from said memory locations through a plurality of sense amplifiers connected to an input/output port, the improvement comprising:
- a row buffer register means having a plurality of parallel inputs connected to transfer data to and from said memory locations through said sense amplifiers, and a transfer port for transferring serial data to and from said row buffer register means;
- a second input/output port connected to said row buffer register transfer port; and
- means for enabling said row buffer register means to transfer a digital word between said memory locations and said row buffer register means, and for enabling a transfer of data between said second input/output port and said row buffer register means, whereby data may be written into or read out of said memory locations through said second input/output port.

9. In a memory for storing a plurality of digital words, each of said words having digits store in a row of memory locations, like digits of said words forming columns, said digital words being transferred to and from said memory locations through a plurality of sense amplifiers connected to an input/output port, the improvement comprising:
- a second input/output port connected for receiving serial data for storage in said memory locations;
- a row buffer register means connected to receive serial data from said second input/output, said row buffer register means having a plurality of parallel output connections to said sense amplifiers; and
- means for enabling said row buffer register means to transfer data to an addressed memory location.

* * * * *